United States Patent
Havanur et al.

(10) Patent No.: US 11,824,523 B2
(45) Date of Patent: Nov. 21, 2023

(54) SEMICONDUCTOR DEVICE WITH MULTIPLE INDEPENDENT GATES

(71) Applicant: Siliconix Incorporated, San Jose, CA (US)

(72) Inventors: Sanjay Havanur, San Jose, CA (US); M. Ayman Shibib, San Jose, CA (US)

(73) Assignee: Vishay-Siliconix, LLC, San Jose, CA (US)

( * ) Notice: Subject to any disclaimer, the term of this patent is extended or adjusted under 35 U.S.C. 154(b) by 0 days.

(21) Appl. No.: 17/561,046

(22) Filed: Dec. 23, 2021

(65) Prior Publication Data

US 2022/0123740 A1    Apr. 21, 2022

Related U.S. Application Data

(62) Division of application No. 16/569,572, filed on Sep. 12, 2019, now Pat. No. 11,218,144.

(51) Int. Cl.

| | | |
|---|---|---|
| H03K 17/0812 | (2006.01) | |
| H03K 17/567 | (2006.01) | |
| H01L 27/07 | (2006.01) | |
| H01L 29/423 | (2006.01) | |
| H01L 29/778 | (2006.01) | |
| H01L 29/866 | (2006.01) | |
| H01L 29/78 | (2006.01) | |
| H01L 29/20 | (2006.01) | |

(52) U.S. Cl.
CPC ... *H03K 17/08122* (2013.01); *H01L 27/0727* (2013.01); *H01L 29/2003* (2013.01); *H01L 29/4236* (2013.01); *H01L 29/7787* (2013.01); *H01L 29/7808* (2013.01); *H01L 29/7813* (2013.01); *H01L 29/866* (2013.01); *H03K 17/567* (2013.01)

(58) Field of Classification Search
None
See application file for complete search history.

(56) References Cited

U.S. PATENT DOCUMENTS

| | | | |
|---|---|---|---|
| 11,218,144 B2 * | 1/2022 | Havanur | H01L 29/7808 |
| 2002/0060340 A1 * | 5/2002 | Deboy | H01L 29/7815 257/E29.198 |
| 2012/0175700 A1 * | 7/2012 | Hsieh | H01L 29/417 257/334 |
| 2014/0042535 A1 * | 2/2014 | Darwish | H01L 29/66727 257/334 |
| 2016/0093719 A1 | 3/2016 | Kobayashi et al. | |
| 2016/0189887 A1 * | 6/2016 | Weis | H03K 17/06 307/113 |
| 2017/0250685 A1 * | 8/2017 | Bina | H01L 29/0895 |

FOREIGN PATENT DOCUMENTS

EP    0517261    12/1992

* cited by examiner

*Primary Examiner* — Jay C Chang

(57) ABSTRACT

Semiconductor device with multiple independent gates. A gate-controlled semiconductor device includes a first plurality of cells of the semiconductor device configured to be controlled by a primary gate, and a second plurality of cells of the semiconductor device configured to be controlled by an auxiliary gate. The primary gate is electrically isolated from the auxiliary gate, and sources and drains of the semiconductor device are electrically coupled in parallel. The first and second pluralities of cells may be substantially identical in structure.

20 Claims, 8 Drawing Sheets

GaN HEMT

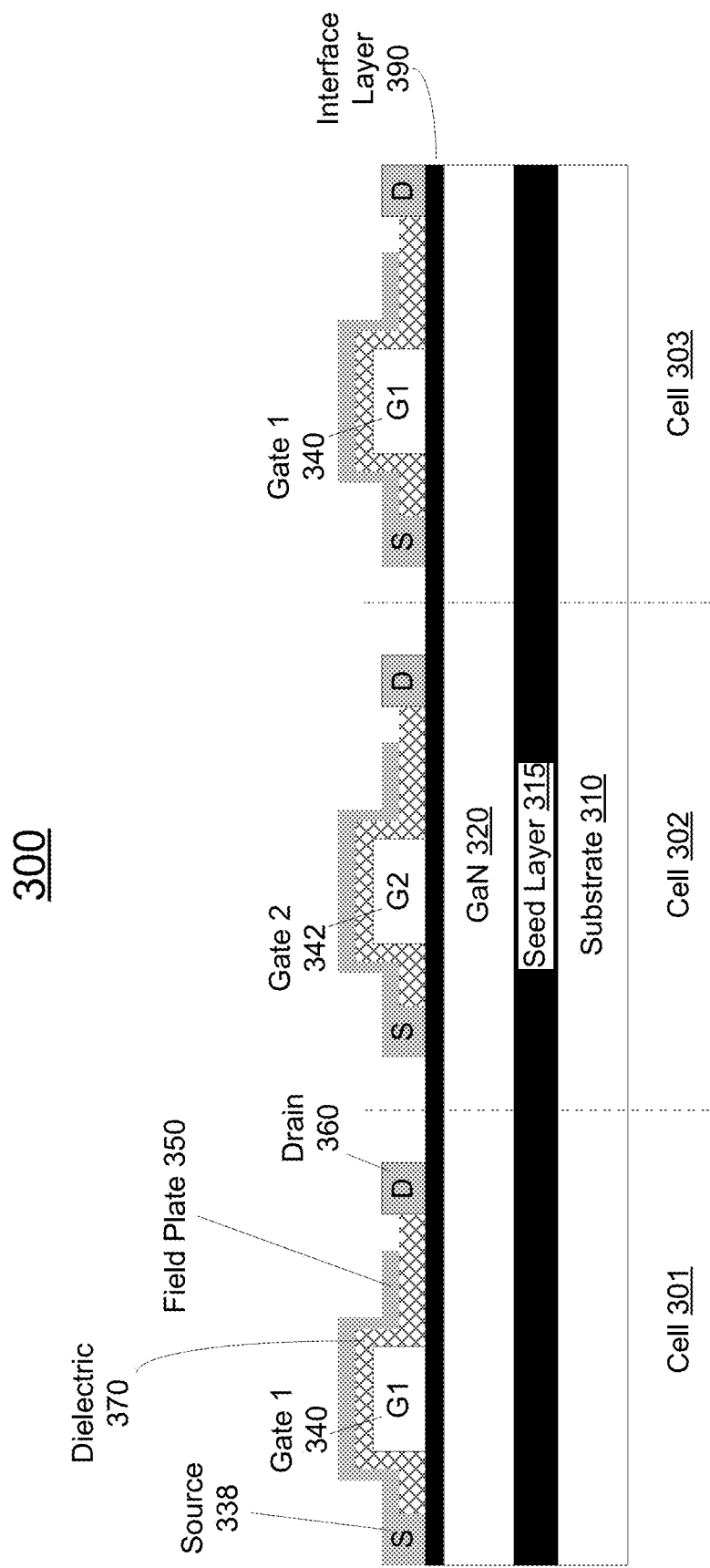

Si MOSFET

GaN HEMT

Rds_clamped x Ias
< User Selected Clamp Voltage

SEMICONDUCTOR DEVICE WITH MULTIPLE INDEPENDENT GATES

RELATED APPLICATION(S)

This Application is a Divisional Application of and claims priority to, commonly owned U.S. patent application Ser. No. 16/569,572, now U.S. Pat. No. 11,218,144, entitled "Semiconductor Device with Multiple Independent Gates," to Havanur and Shibib, filed Sep. 12, 2019, which is incorporated herein by reference in its entirety.

FIELD OF INVENTION

Embodiments of the present invention relate to the field of integrated circuit design, manufacture, and use. More specifically, embodiments of the present invention relate to systems and methods for semiconductor devices with multiple independent gates.

BACKGROUND

Power semiconductors are extensively used in electronic circuits, e.g., power supplies, for switching purposes. System designers using power semiconductors in a wide variety of applications face several challenges to ensure safe and reliable operation under a range of conditions. One extreme condition is Unclamped Inductive Switching (UIS).

Whenever current through an inductive load is quickly turned off, the stored magnetic energy induces a counter electromagnetic force (EMF) that can build up very high potentials across the switch. At the instant of turn off $t_1$, the inductive load L is carrying a peak current of $I_{DSPK}$. This corresponds to a stored energy of $\frac{1}{2} L \times I_{DSPK}^2$. The semiconductor switch needs to absorb this energy stored in the inductive load, which results in high voltage and current stresses simultaneously. In the process of absorbing the energy, the voltage across the switch terminals will continue to rise and, if the stored energy in the inductor is sufficiently high, the semiconductor breaks down completely.

In case of silicon MOSFETs with integrated body diodes, the device enters into avalanche mode, carrying a drain source voltage of $V_{AVALANCHE}$ while the current ramps down from $I_{DSPK}$ to zero in the time interval $t_2$-$t_1$. $V_{AVALANCHE}$ is typically higher, sometimes as much 50% more, than the rated voltage $V_{DS}$. In many applications, particularly in the automotive environments, this situation can happen repeatedly, thereby continuously stressing the power device. In some cases, the full buildup of this induced potential may far exceed the rated breakdown ($V_{(BR)DSS}$) of the transistor, thus resulting in catastrophic failure.

It is appreciated that UIS is a condition of the operating environment, and may thus occur independently of the technology of a power semiconductor. Wide bandgap material based switching elements like gallium nitride (GaN) do not have intrinsic body diodes, and as a result have no avalanche capability of any kind. Their drain source voltage can increase much beyond the rated voltage and, if the unclamped energy is high enough will reach destructive levels. A single unclamped energy dump can destroy the device completely.

SUMMARY OF THE INVENTION

Therefore, what is needed are systems and methods for semiconductor devices with multiple independent gates. An additional need exists for systems and methods for semiconductor devices with multiple independent gates that facilitate over-voltage protection. What is further needed are systems and methods for semiconductor devices with multiple independent gates that are applicable to both MOSFETs and HEMTs. A still further need exists for systems and methods for semiconductor devices with multiple independent gates that are compatible and complementary with existing systems and methods of integrated circuit design, manufacturing, test, and use. Embodiments of the present invention provide these advantages.

In accordance with an embodiment of the present invention, a gate-controlled semiconductor device includes a first plurality of cells of the semiconductor device configured to be controlled by a primary gate, and a second plurality of cells of the semiconductor device configured to be controlled by an auxiliary gate. The primary gate is electrically isolated from the auxiliary gate, and sources and drains of the semiconductor device are electrically coupled in parallel. The first and second pluralities of cells may be substantially identical in structure.

In accordance with another embodiment of the present invention, a gate-controlled semiconductor device includes a source terminal, and a drain terminal. In addition, the semiconductor device includes a primary gate terminal configured to control current from the drain terminal to the source terminal in a first fraction of channel area of the semiconductor device. Further, the semiconductor device includes an auxiliary gate terminal configured to control current from the drain terminal to the source terminal in a second fraction of channel area of the semiconductor device.

In accordance with a further embodiment of the present invention, a gate-controlled semiconductor device includes a plurality of primary cells. The plurality of primary cells includes primary source, primary drain, and primary channel regions. The plurality of primary cells also includes a primary gate electrode coupled to a primary gate terminal of the semiconductor device. The gate-controlled semiconductor device also includes a plurality of auxiliary cells. The plurality of auxiliary cells includes auxiliary source, auxiliary drain, and auxiliary channel regions. The plurality of auxiliary cells also includes an auxiliary gate electrode coupled to an auxiliary gate terminal of the semiconductor device. The primary source and the primary drain are coupled in parallel with the auxiliary source and the auxiliary drain forming a common source and a common drain. The primary gate terminal and the auxiliary gate terminal are electrically isolated.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

FIG. 3 illustrates an exemplary gallium nitride-based High Electron Mobility Transistor (HEMT), in accordance with embodiments of the present invention.

embodiment of a semiconductor device with multiple independent gates, in accordance with embodiments of the present invention.

Figure 4B:
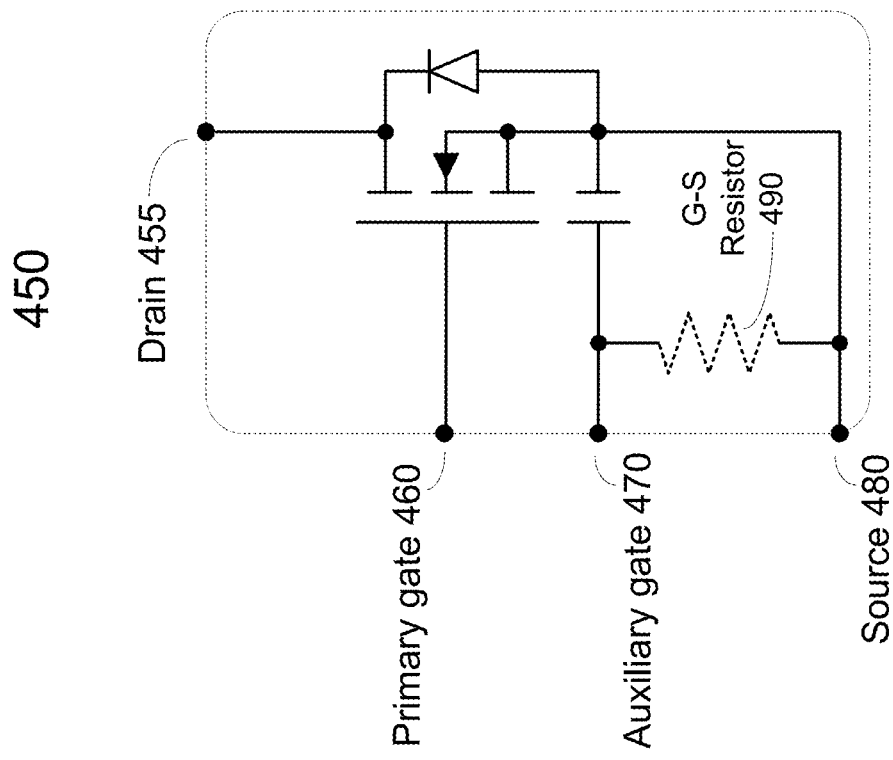
FIG. 4A illustrates an exemplary schematic of a gallium nitride-based High Electron Mobility Transistor (HEMT)

FIG. 4B illustrates an exemplary schematic of a silicon based Metal Oxide Semiconductor Field Effect Transistor (MOSFET) embodiment of a semiconductor device with multiple independent gates, in accordance with embodiments of the present invention.

Figure 5:
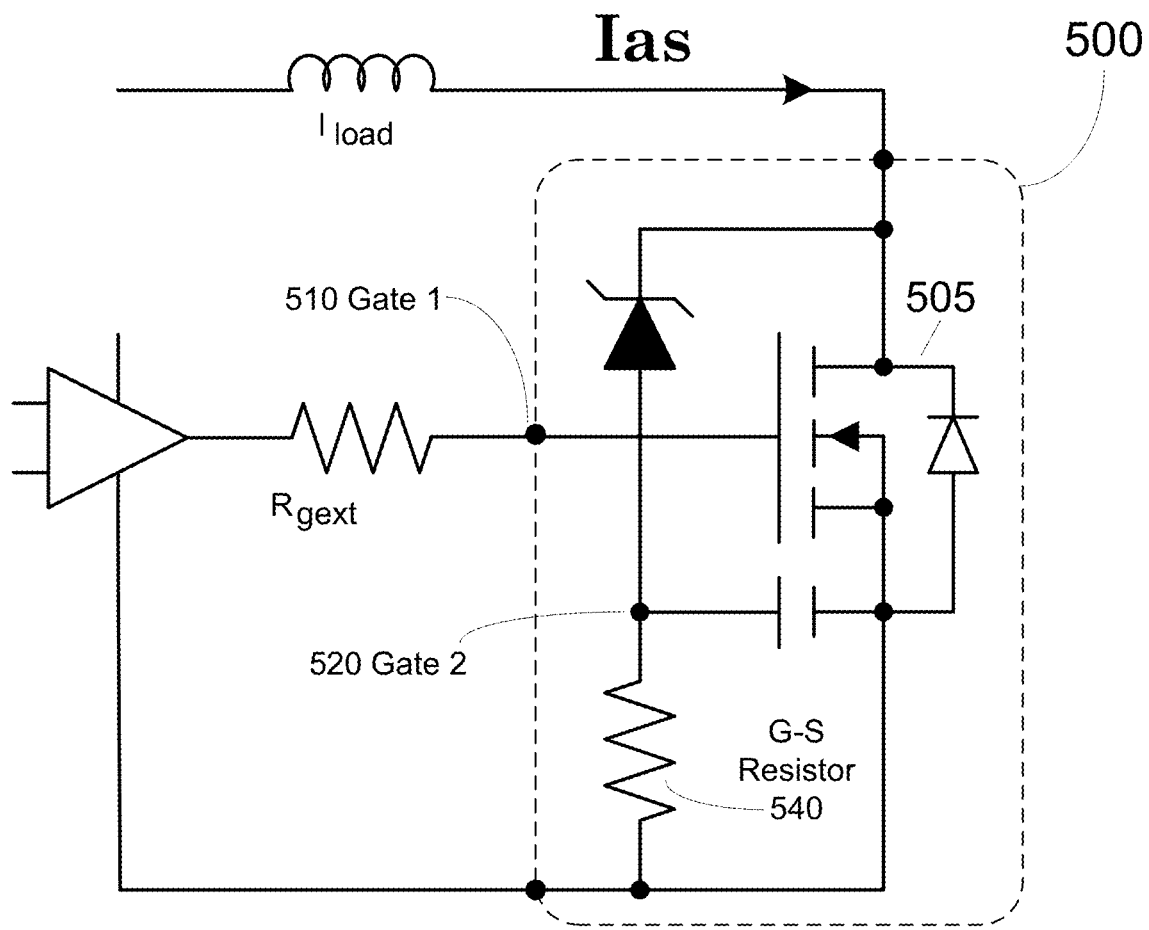

FIG. 5 illustrates an exemplary schematic of an application for a semiconductor device with multiple independent gates with internal active clamp circuit, in accordance with embodiments of the present invention.

Figure 6:
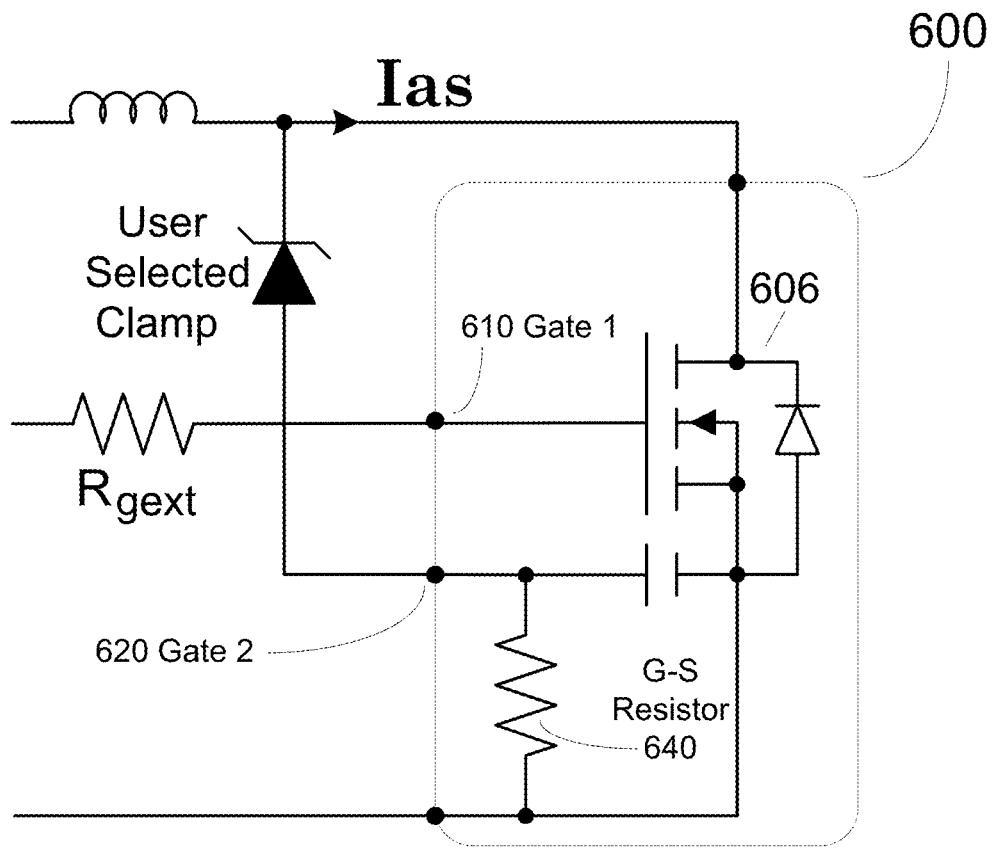

FIG. 6 illustrates an exemplary schematic of an application for a semiconductor device with multiple independent gates with external active clamp circuit, in accordance with embodiments of the present invention.

Figure 7:
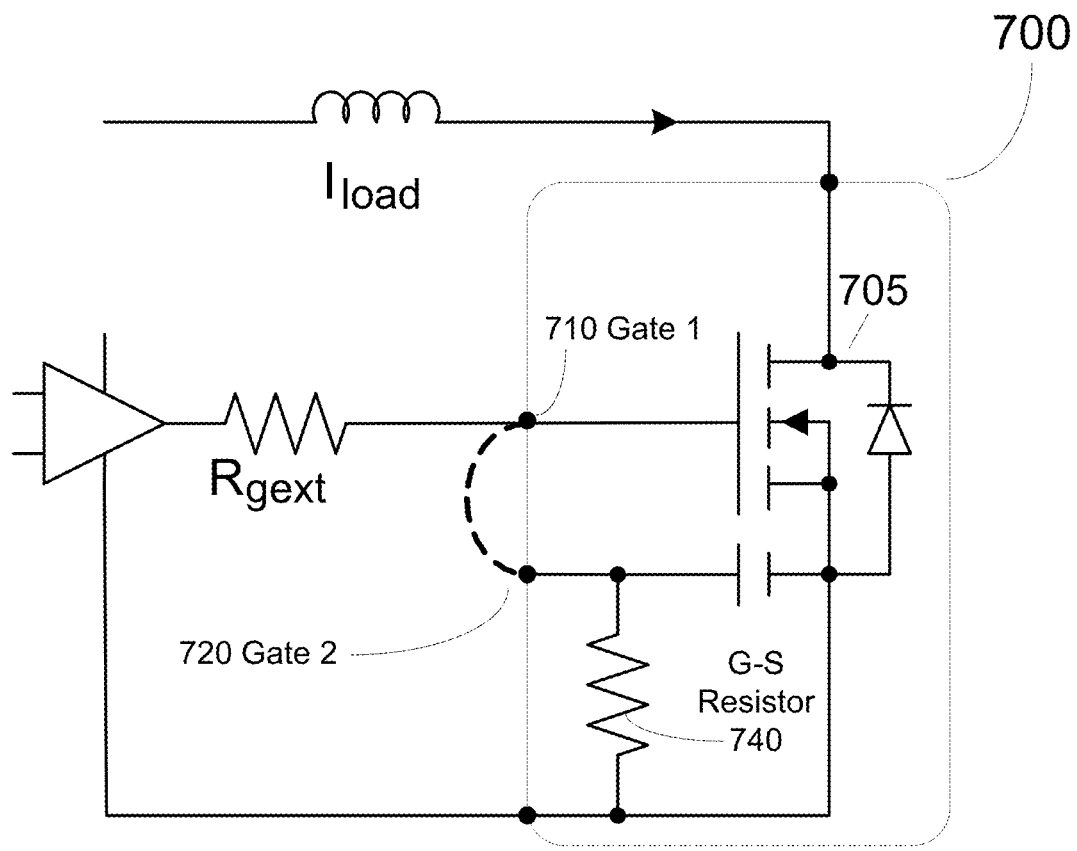

FIG. 7 illustrates an exemplary schematic of an application for a semiconductor device with multiple independent gates, in accordance with embodiments of the present invention.

Figure 8:
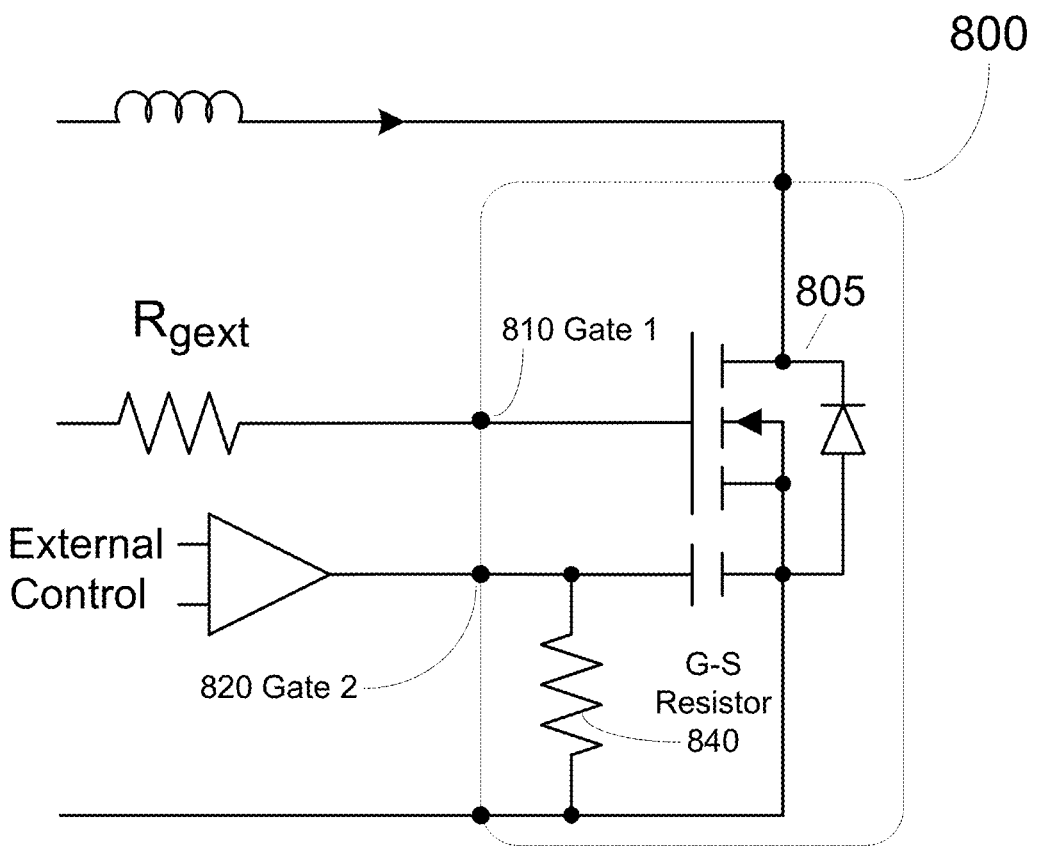

FIG. 8 illustrates an exemplary schematic of an application for a semiconductor device with multiple independent gates, in accordance with embodiments of the present invention.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, a method, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching," "adding," "removing" or the like, refer to actions and processes of semiconductor device fabrication.

NOTATION AND NOMENCLATURE

The figures are not drawn to scale, and only portions of the structures, as well as the various layers that form those structures, may be shown in the figures. The figures, in general, illustrate symbolic and simplified structures to convey understanding of the invention, and are not intended to reproduce physical structures in detail. Furthermore, fabrication processes and operations may be performed along with the processes and operations discussed herein; that is, there may be a number of process operations before, in between and/or after the operations shown and described herein. Importantly, embodiments in accordance with the present invention can be implemented in conjunction with these other (perhaps conventional) processes and operations without significantly perturbing them. Generally speaking, embodiments in accordance with the present invention may replace and/or supplement portions of a conventional process without significantly affecting peripheral processes and operations.

The term "MOSFET" is generally understood to be synonymous with the term insulated-gate field-effect transistor (IGFET), as many modern MOSFETs comprise a non-metal gate and/or a non-oxide gate insulator. As used herein, the term "MOSFET" does not necessarily imply or require FETs that include metal gates and/or oxide gate insulators. Rather, the term "MOSFET" includes devices commonly known as or referred to as MOSFETs.

As used herein, the letter "n" refers to an n-type dopant and the letter "p" refers to a p-type dopant. A plus sign "+" or a minus sign "−" is used to represent, respectively, a relatively higher or relatively lower concentration of such dopant(s). However, such use does not limit the absolute doping range or other aspects of these regions. For example, a doping area described as n+ or n− may also be described as an n-type doping region alternatively.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. Some of the figures are discussed in the context of an n-channel device; however, embodiments according to the present invention are not so limited. That is, the features described herein may be utilized in a p-channel device. The discussion of an n-channel device can be readily mapped to a p-channel device by substituting p-type dopants and/or materials for corresponding n-type dopant and/or materials, and vice versa.

The term "trench" has acquired two different, but related meanings within the semiconductor arts. Generally, when referring to a process, e.g., etching, the term trench is used to mean or refer to a void of material, e.g., a hole or ditch, formed in, for example, an epitaxial ("epi") layer. Generally, the length of such a hole is much greater than its width or depth. However, when referring to a semiconductor structure or device, the term trench is used to mean or refer to a solid vertically-aligned structure, disposed beneath a primary surface of a substrate, having a complex composition, different from that of the substrate. A trench structure is frequently adjacent to a channel of a vertical trench field effect transistor (FET). The structure may comprise, for example, a gate of an FET. The term "trench structure" may be used herein at times to distinguish a filled or partially filled trench from an empty or unfilled trench. At other times, the manner in which these terms are being used will be evident from the context of the surrounding discussion.

It is to be appreciated that although the semiconductor structure commonly referred to as a "trench structure" may be formed by etching a trench and then filling the trench, the use of the structural term herein in regards to embodiments of the present invention does not imply, and is not limited to such processes.

The term "substantially" in the description and/or claims of the present application is used to refer to design intent, rather than a physical result. The semiconductor arts have deployed an ability to measure numerous aspects of a semiconductor to a high degree of accuracy. Accordingly, when measured to available precision, in general, no physical aspect of a semiconductor is precisely as designed. Further, measurement technology may readily identify differences in structures that are intended to be identical. Accordingly, terms such as "substantially equal" should be interpreted as designed to be equal, subject to manufacturing variation and measurement precision.

The "width" of a trench, or structure within a trench, is understood to refer to a horizontal dimension that is perpendicular to the long extent of such a trench.

While the descriptions and drawings herein refer to silicon-based Metal Oxide Semiconductor Field Effect Transistors (MOSFETs) and/or High Electron Mobility Transistors (HEMTs) based on wide bandgap materials, for example, gallium nitride (GaN), for purposes of illustration, embodiments in accordance with the present invention are applicable and well suited to any power semiconductor that is operated through a gate terminal, including, for example, planar MOSFETs, trench MOSFETs, Super Junction MOSFETS, Split Gate or Shielded Gate MOSFETs, IGBTs and, Silicon Carbide FETs. The embodiments of the present invention are also applicable to composite or cascode devices that incorporate a silicon MOSFET as the switching element along with a GaN HEMT or a SiC FET, for example.

Semiconductor Device with Multiple Independent Gates

Power semiconductor devices, e.g., field effect transistors (FETs) configured for switching large currents and/or voltages, typically comprise a large number of substantially similar cells. Each such cell is configured as a FET. Generally, the terminals, e.g., source, drain and gate terminals, of all such cells are electrically coupled so that the power device comprises a multitude of cells coupled and controlled in parallel.

In accordance with embodiments of the present invention, a fraction of the total of such cells is controlled independently from the majority of cells. The selected fraction of cells have their gates connected together, but are electrically separate from the primary gate, to form one or more "auxiliary" gate terminal(s). Such cells comprising an auxiliary gate may be known as or referred to as "auxiliary cells." The majority of cells, e.g., cells comprising a primary gate, may be known as or referred to as "primary cells." For example, a majority of cells are coupled to a first or "primary" gate terminal, while a fraction of cells are coupled to a second or "auxiliary" gate terminal that is independent of the first gate terminal.

Figure 1:
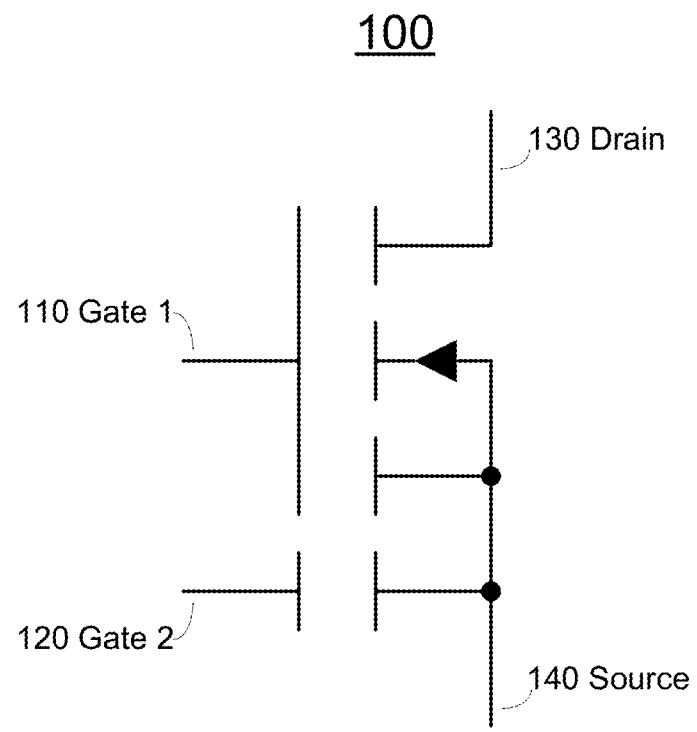
FIG. 1 illustrates an exemplary schematic symbol for a semiconductor device with multiple independent gates, in accordance with embodiments of the present invention.

FIG. 1 illustrates an exemplary schematic symbol for a semiconductor device with multiple independent gates 100, in accordance with embodiments of the present invention. One auxiliary gate is illustrated in FIG. 1; however, there may be more than one auxiliary gate, e.g., more than two independent gates, in some embodiments. Semiconductor device 100 comprises a single source terminal 140 and a single drain terminal 130. For example, the source and drain terminals of all cells of semiconductor device 100 are coupled in parallel. A majority of cells have their gate electrodes coupled to primary gate terminal 1, reference 110. A fraction of cells have their gate electrodes coupled to gate terminal 2, reference 120. As is typical for power semiconductors, the body of the FET is coupled to the source; however, that is not required, and embodiments in accordance with the present invention are well suited to devices in which the body is floating or coupled to a non-source potential, e.g., a body-biased device. In accordance with embodiments of the present invention, a body terminal may be exposed on a package pin. A body diode (not shown) may or may not be present.

Semiconductor device 100 may be operated as a conventional semiconductor switch via the primary gate terminal. The auxiliary gate terminal may be internally coupled to the drain terminal through a Zener diode or other mechanisms to implement, for example, active clamping of peak voltage between drain and source. Alternately, the auxiliary gate terminal may be brought out as an additional terminal to be utilized for a variety purposes in addition to voltage clamping. The structure may be embodied, for example, in silicon-based Metal Oxide Semiconductor Field Effect Transistors (MOSFETs) as well as in High Electron Mobility Transistors (HEMTs) based on wide bandgap materials, for example, gallium nitride (GaN).

Figure 2:
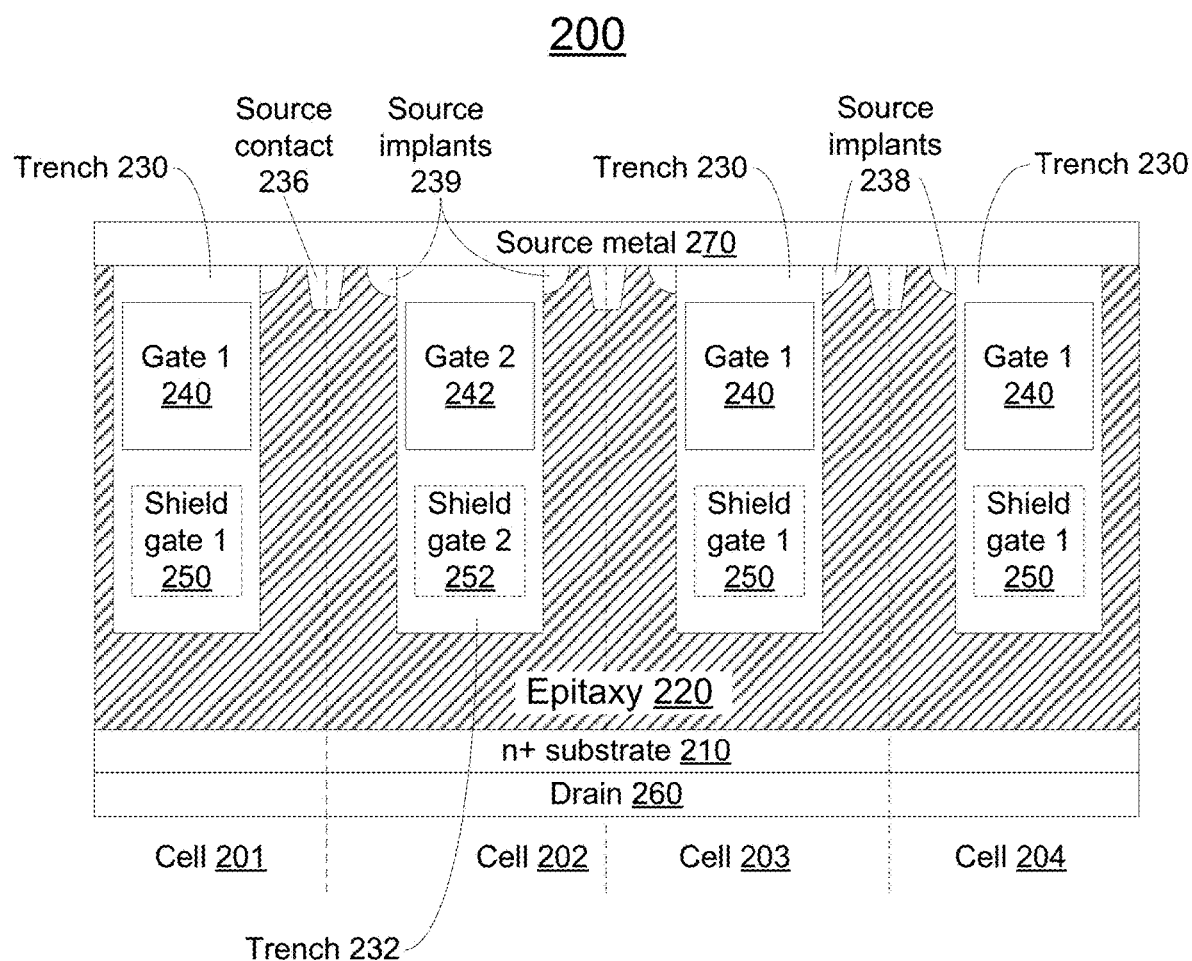
FIG. 2 illustrates an exemplary silicon-based vertical trench MOSFET, in accordance with embodiments of the present invention.

FIG. 2 illustrates an exemplary silicon-based vertical trench MOSFET 200, in accordance with embodiments of the present invention. FIG. 2 illustrates four cells of MOSFET 200, cells 201, 202, 203, and 204. It is appreciated that practical devices will typically have a multitude of substantially similar cells, e.g., thousands. Cell 201 comprises a trench 230 formed in epitaxy 220 on substrate 210, which may be highly doped single crystal silicon, in some embodiments. The trenches 230, 232 may extend into the substrate 210 in some embodiments. Trench 230 comprises a gate 1 electrode 240, e.g., comprising poly silicon. Trench 230 may optionally comprise a shield gate 1 electrode 250, electrically isolated from gate 1 electrode 240. Shield gate 1 electrode 250 may be coupled to the source potential, for example.

Cell 201 further comprises a source 238, which may be, for example, an implanted region, and a source contact 236. As is typical, the gate 1 electrode 240 and the shield gate 1 electrode 250 are electrically insulated from each other and other structures by a trench oxide, which typically fills the trench 230. MOSFET 200 will typically also comprise a source metal layer 270, and a drain terminal 260 on the back side of substrate 210.

MOSFET 200 typically comprises a great many cells placed at regular intervals known as a "cell pitch." The majority of such cells are substantially identical to cell 201, and the source, drain, and gates of such majority cells are coupled in parallel. For example, in FIG. 2, cells 203 and 204 are substantially identical to cell 201 and are considered primary cells.

In accordance with embodiments of the present invention, cell 202 of MOSFET 200 is different from cells 201, 203, and/or 204. Cell 202 may be considered to be an "auxiliary cell." Cell 202 comprises a trench 232. The trench 232 comprises a gate 2 electrode 242 and optionally comprises a shield gate 2 electrode 252. Cell 202 further comprises source implants 239. Gate 2 electrode 242 is not directly coupled to the gates of the majority cells, and is considered an auxiliary gate. For example, gate 2 electrode 242 is not directly coupled to gate 1 electrode 240. Typically, the primary cells and the auxiliary cells have the same source terminal. For example, the source implants 239 of auxiliary cell 202 are coupled to the source implants of the primary cells, e.g., source implants 238.

As gate 2 electrode 242 is not directly coupled to the gates of the majority cells, the gate 2 electrode 242 of the auxiliary cells will typically have a different gate runner (not shown) from a gate runner for the primary cells, e.g., gate 1 electrode 240. Aside from structural differences related to the coupling of the gate 2 electrode 242 versus the coupling of gate 1 electrode 240, the structure of the auxiliary cells may be substantially similar to the structure of the primary cells. For example, the structure of auxiliary cell 202 may be substantially similar to the structure of primary cells 201, 203, and/or 204.

In accordance with embodiments of the present invention, the size, depth, and/or composition of the trench 232, gate 2 electrode 242, optional shield gate 2 electrode 252, and/or source implants 239 of cell 202 may be substantially the same as the size, depth, and/or composition of the trench 230, gate 1 electrode 240, optional shield gate 1 electrode 250, and/or source implants 233 of cell 201. For example, all such structures in cells 201, 202, 203, 204 may be formed by the same process steps and masks of a semiconductor manufacturing process.

In accordance with embodiments of the present invention, the size, depth, and/or composition of the structures of auxiliary cell 202 may differ from the corresponding elements of primary cell 201. For example, changes to the shape of gate 2 electrode 242, a thickness of side oxide within trench 232, and/or changes to doping concentration of source implants 239, relative to the corresponding elements of cell 201, may advantageously adjust a threshold voltage (Vth) of auxiliary cell 202 relative to the threshold voltage of primary cell 201.

Gallium nitride (GaN) has been considered for power semiconductors. Gallium nitride conducts electrons more than 1000 times more efficiently than silicon. Gallium nitride also requires orders of magnitude less charge to turn on the channel (Qg). The cost to produce a GaN device is presently higher than the cost to produce a silicon-based MOSFET device, although gallium nitride devices may be produced using standard silicon manufacturing processes on the same process lines used to produce silicon semiconductors. The resulting GaN devices may be much smaller than silicon devices for the same functional performance, due to the much higher conductance of GaN. Since the individual devices are much smaller than silicon devices, many more GaN devices can be produced per wafer, thus leading to higher manufacturing yields than their silicon counterparts.

FIG. 3 illustrates an exemplary gallium nitride-based High Electron Mobility Transistor (HEMT) 300, in accordance with embodiments of the present invention. FIG. 3 illustrates three cells of HEMT 300, cells 301, 302, and 303. It is appreciated that practical devices will typically have a multitude of substantially similar cells, e.g., thousands.

Seed layer 315, e.g., aluminum nitride (AlN) may be grown on a substrate 310, e.g., silicon. Gallium nitride layer 320 may be grown on the seed layer 315. A thin interface layer 390, e.g., comprising aluminum gallium nitride (Al-GaN) may be formed on top of the gallium nitride layer 320. Source electrodes, e.g., source 338, drain electrodes, e.g., drain 360, and gate electrodes, e.g., gate 1 electrode 340 may be formed on top of the interface layer 390. The source material may extend over the gate electrode and form a field plate, e.g., field plate 350 between the gate and drain. A dielectric 370 may separate the gate from the source material.

The sources, e.g., source 338, and drains, e.g., drain 360, of all cells of HEMT 300 are coupled in parallel. Primary cells 301 and 303 represent the majority of cells of HEMT 300. The gates, e.g., gate 1 electrodes 340, of cells 301 and 303 are coupled in parallel. Auxiliary cell 302 differs from primary cells 301 and 303 at least in that gate 2 electrode 342 is not directly coupled to the gate 1 electrodes 340.

As previously described with respect to MOSFET 200 (FIG. 2), all cells of HEMT 300 may comprise substantially identical structures, formed by the same process steps and masks of a semiconductor manufacturing process, in accordance with embodiments of the present invention. It is appreciated that there will be slight differences beyond the cell level related to different couplings of the gate 2 electrode 342 relative to the gate 1 electrode 340, e.g., differences in gate runners.

Also as previously described with respect to MOSFET 200 (FIG. 2), the elements of the fraction of cells, e.g., auxiliary cell 302, may differ from the elements of the majority of cells, e.g., primary cells 301, 303, in accordance with embodiments of the present invention. For example, changes to the size, shape, and/or composition of the structures of cell auxiliary 302 may advantageously adjust a threshold voltage (Vth) of cell 302 relative to the threshold voltage of primary cell 301.

One drawback of gallium nitride in power applications is the lack of an intrinsic body diode. For wide bandgap devices like gallium nitride (GaN), there is no integrated body diode and therefore no avalanche mode. Under unclamped inductive switching in such devices, drain-source voltage (Vds) will rise until the device simply ruptures.

Embodiments in accordance with the present invention are well suited to implementation of "active clamp" circuitry to protect a power semiconductor device from avalanche during Unclamped Inductive Switching (UIS).

Whenever current through an inductive load is quickly turned off, the magnetic energy induces a counter electro-magnetic force (EMF) that can build up very high potentials across the switch. Mechanical switches often have spark-suppression circuits to reduce these harmful effects that result when current is suddenly interrupted. However, when transistors are used as the switches, the full buildup of this induced potential may far exceed the rated breakdown ($V_{(BR)DSS}$) of the transistor, thus resulting in catastrophic failure.

To limit Vds and to avoid avalanche during a UIS event, an "active clamp" circuit may be utilized. Clamping circuits are highly beneficial to gallium nitride semiconductors, for example. One such active clamp circuit utilizes a Zener diode from drain to gate to clamp Vds below its rated value. Unfortunately, neither the device manufacturer nor the end user knows the device capability or "ruggedness" under active clamp. It is neither characterized nor tested at any stage. End users create their own active clamp implementations and rely on limited empirical data to determine the clamp's effectiveness. Thus, a device with an integrated active clamp feature is highly desirable.

Figure 4A:
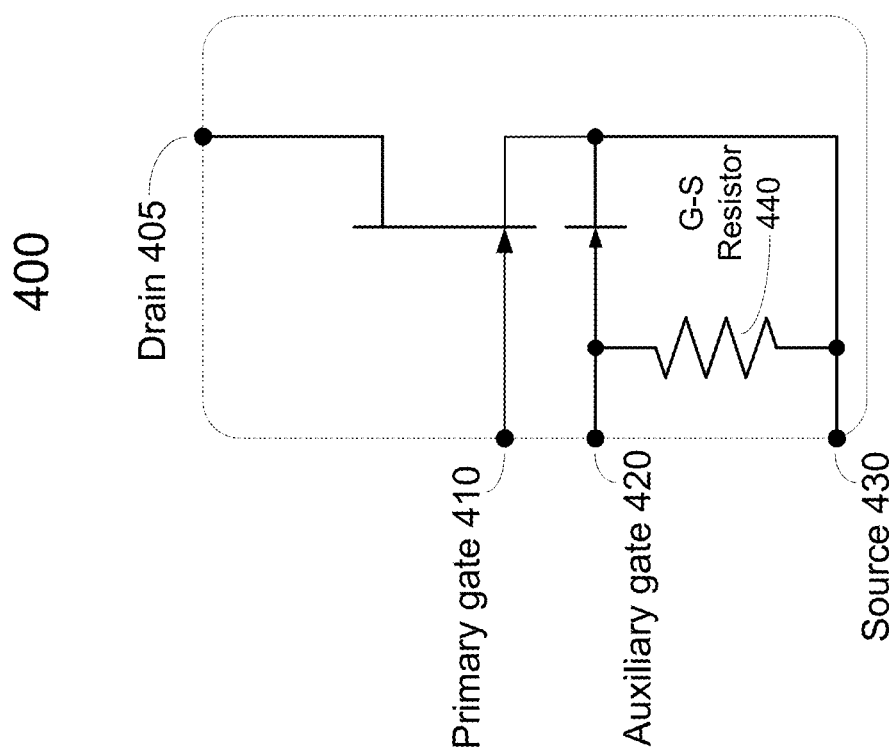

FIG. 4A illustrates an exemplary schematic of a gallium nitride-based High Electron Mobility Transistor (HEMT) 400 embodiment of a semiconductor device with multiple independent gates, in accordance with embodiments of the present invention. One auxiliary gate 420 is illustrated in FIG. 4A; however, there may be more than one auxiliary gate, e.g., more than two independent gates, in some embodiments. Semiconductor device 400 comprises a single source terminal 430 and a single drain terminal 405. For example, the source and drain terminals of all cells of semiconductor device 400 are coupled in parallel.

Device 400 typically comprises a great many cells placed at regular intervals known as a "cell pitch." The majority of such cells are substantially identical. A majority of cells have their gate electrodes coupled to primary gate terminal 410. A fraction of cells have their gate electrodes coupled to auxiliary gate terminal 420. A gate-source resistor 440, for example, 5-10 kohms, may be utilized for noise immunity.

Semiconductor device 400 may be operated as a conventional semiconductor switch via the primary gate terminal, e.g., utilizing the majority of cells. The auxiliary gate terminal 420 may be utilized for a variety purposes, for example, for voltage clamping, as further disclosed below.

FIG. 4B illustrates an exemplary schematic of a silicon based Metal Oxide Semiconductor Field Effect Transistor (MOSFET) 450 embodiment of a semiconductor device with multiple independent gates, in accordance with embodiments of the present invention. One auxiliary gate 470 is illustrated in FIG. 4B; however, there may be more than one auxiliary gate, e.g., more than two independent gates, in some embodiments. Semiconductor device 450 comprises a single source terminal 480 and a single drain terminal 455. For example, the source and drain terminals of all cells of semiconductor device 450 are coupled in parallel.

Device 450 typically comprises a great many cells placed at regular intervals known as a "cell pitch." The majority of such cells are substantially identical. A majority of cells have their gate electrodes coupled to primary gate terminal 460. A fraction of cells have their gate electrodes coupled to auxiliary gate terminal 470. A gate-source resistor 490, for example, 5-10 kohms, may be utilized for noise immunity.

Semiconductor device 450 may be operated as a conventional semiconductor switch via the primary gate terminal, e.g., utilizing the majority of cells. The auxiliary gate terminal 470 may be utilized for a variety purposes, for example, for voltage clamping, as further disclosed below.

FIG. 5 illustrates an exemplary schematic of an application for a semiconductor device with multiple independent gates with internal active clamp circuit 500, in accordance with embodiments of the present invention. Device 500 comprises a semiconductor device with multiple independent gates 505. Device 505 may correspond to device 100 (FIG. 1), device 200 (FIG. 2) and/or device 300 (FIG. 3), for example. The Zener diode may be part of the die comprising device 505, or the Zener diode may be on a separate die contained within a multi-die semiconductor package also comprising device 505. Device 500 comprises a "primary" gate, gate 1 reference 510, exposed on a package pin. Gate 1 reference 510 represents the gates of the majority of (primary) cells of the power semiconductor 505, and may be utilized to control the primary switching function of the power semiconductor 505. Device 500 further comprises an "auxiliary" gate, gate 2 reference 520. Gate 2 reference 520 represents the gates of the fraction of (auxiliary) cells of the power semiconductor 505. Gate 2 reference 520 may or may not be exposed on a package pin, in accordance with embodiments of the present invention.

The auxiliary gate, gate 2 reference 520, is internally coupled to the drain through a Zener or a functionally similar mechanism. When the drain voltage exceeds the limit set by design, the Zener or the functionally similar mechanism will begin to conduct. The resulting current will enhance the auxiliary gate and put the power semiconductor in the forward conduction mode, with the drain voltage within safe limits.

In accordance with embodiments of the present invention, a ratio of a number primary cells of the power semiconductor 505 to a number of auxiliary cells of the power semiconductor 505 may be designed so that the effective resistance of all auxiliary cells is in the range of 50-200 times the effective resistance of all primary cells. In some embodiments, the effective resistance of all auxiliary cells may be in the range of 90-110 times the effective resistance of all primary cells.

In general, the auxiliary cells may be evenly distributed among the majority of primary cells, in accordance with embodiments of the present invention. Such an arrangement may improve thermal dissipation of the auxiliary cells. For example, if a ratio of auxiliary cells to primary cells is 1 auxiliary cell to 99 primary cells, e.g., 1%, then the semiconductor 505 may be designed such that every one hundredth cell in sequence is an auxiliary cell.

The nominal Zener voltage may be 10% to 15% below the rated Vds of the power semiconductor 505. It is appreciated that clamp operation of device 500 does not necessarily imply operation in a linear mode. For example, a MOSFET may be fully enhanced, but with a larger Rdson. A gate-source resistor 540, for example, 5-10 kohms, may be utilized for noise immunity. In accordance with embodiments of the present invention, gate 1 reference 510 and gate 2 reference 520 may have different threshold voltages (Vth), to improve operating characteristics. Typically the threshold (Vth) of the auxiliary gate 2 reference 520 is set higher to avoid spurious turn on of the power semiconductor 505.

FIG. 6 illustrates an exemplary schematic of an application for a semiconductor device with multiple independent gates with external active clamp circuit 600, in accordance with embodiments of the present invention. Device 600 comprises a semiconductor device with multiple independent gates 605. Device 605 may correspond to device 100 (FIG. 1), device 200 (FIG. 2) and/or device 300 (FIG. 3), for example. The Zener diode is external to device 600. It is appreciated that the Zener diode is a symbolic representation only and can be any circuit, e.g., a circuit, mechanism and/or device, that has a clamping property. Device 600 comprises a "primary" gate, gate 1 reference 610, exposed on a package pin. Gate 1 reference 610 represents the gates of the majority of cells of the power semiconductor 605, and may be utilized to control the primary switching function of the power semiconductor 605. Device 600 further comprises an "auxiliary" gate, gate 2 reference 620. Gate 2 reference 620 represents the gates of the fraction of cells of the power semiconductor 605. Gate 2 reference 620 is exposed on a package pin, in accordance with embodiments of the present invention. A gate-source resistor 640, for example, 5-10 kohms, may be utilized for noise immunity.

FIG. 7 illustrates an exemplary schematic of an application for a semiconductor device with multiple independent gates 700, in accordance with embodiments of the present invention. Device 700 comprises a semiconductor device with multiple independent gates 705. Device 705 may correspond to device 100 (FIG. 1), device 200 (FIG. 2) and/or device 300 (FIG. 3), for example. Device 700 comprises a "primary" gate, gate 1 reference 710, exposed on a package pin. Gate 1 reference 710 represents the gates of the majority of cells of the power semiconductor 705, and may be utilized to control the primary switching function of the power semiconductor 705. Device 700 further comprises an "auxiliary" gate, gate 2 reference 720. Gate 2 reference 720 represents the gates of the fraction of cells of the power semiconductor 705. Gate 2 reference 720 is exposed on a package pin, in accordance with embodiments of the present invention. A gate-source resistor 740, for example, 5-10 kohms, may be utilized for noise immunity.

In the embodiment of FIG. 7, gate 1 reference 710 and gate 2 reference 720 are tied together, external to the package 700, so that the power semiconductor 705 may be operated as a conventional switching device. It is appreciated that exposing the gate 2 reference 720 terminal on an external pin enables the same device 700 to be utilized in two different application—the application of FIG. 6, e.g., with an active clamp based on an external Zener diode, and the application of FIG. 7.

FIG. 8 illustrates an exemplary schematic of an application for a semiconductor device with multiple independent gates 800, in accordance with embodiments of the present invention. Device 800 is illustrated functionally coupled to an exemplary external control circuit. Device 800 comprises a semiconductor device with multiple independent gates 805. Device 805 may correspond to device 100 (FIG. 1), device 200 (FIG. 2) and/or device 300 (FIG. 3), for example. Device 800 comprises a "primary" gate, gate 1 reference 810, exposed on a package pin. Gate 1 reference 810 represents the gates of the majority of cells of the power semiconductor 805, and may be utilized to control the primary switching function of the power semiconductor 805. Device 800 further comprises an "auxiliary" gate, gate 2 reference 820. Gate 2 reference 820 represents the gates of the fraction of cells of the power semiconductor 805. Gate 2 reference 820 is exposed on a package pin, in accordance with embodiments of the present invention. A gate-source resistor 840, for example, 5-10 kohms, may be utilized for noise immunity.

The embodiment of FIG. 8 is configured for external independent control of the primary gate 810 and the secondary gate 820. The external circuit may be configured to sense a variety of different circuit conditions and turn on the power switch through the auxiliary gate. This can enable an "active" and/or variable clamping mode for the power semiconductor 805. For example an external comparator may be utilized to sense a rapid rise of the drain voltage $V_{DS}$ of the power semiconductor and turn it on at a precise threshold. A further refinement may be to program the $V_{DS}$ threshold based on other operating conditions in the circuit. The embodiments of FIG. 6 and FIG. 7 provide a predetermined clamp level based on the Zener voltage, while the embodiment of FIG. 8 offers much greater flexibility in the clamping mechanism.

Embodiments in accordance with the present invention provide systems and methods for semiconductor devices with multiple independent gates. In addition, embodiments in accordance with the present invention provide systems and methods for semiconductor devices with multiple independent gates that facilitate over-voltage protection. Further, embodiments in accordance with the present invention provide systems and methods for semiconductor devices with multiple independent gates that are applicable to both MOSFETs and HEMTs. Still further, embodiments in accordance with the present invention provide systems and methods for semiconductor devices with multiple independent gates that are compatible and complementary with existing systems and methods of integrated circuit design, manufacturing, test, and use.

Various embodiments of the invention are thus described. While the present invention has been described in particular embodiments, it should be appreciated that the invention should not be construed as limited by such embodiments, but rather construed according to the below claims.

What is claimed is:

1. A gate-controlled semiconductor device comprising:
   a first plurality of cells of said semiconductor device configured to be controlled by a primary gate;
   a second plurality of cells of said semiconductor device configured to be controlled by an auxiliary gate,
   wherein said primary gate is electrically isolated from said auxiliary gate,
   wherein said primary gate and said auxiliary gate are electrically isolated from sources and drains of said semiconductor device, and
   wherein sources and drains of said semiconductor device are electrically coupled in parallel.

2. The semiconductor device of claim 1 wherein said first and second pluralities of cells are substantially identical in structure.

3. The semiconductor device of claim 1 wherein each cell of said first plurality of cells comprises a trench comprising a gate electrode.

4. The semiconductor device of claim 3 wherein said trench comprises a shield electrode, electrically isolated from said gate electrode.

5. The semiconductor device of claim 4 wherein said shield electrode is coupled to a source potential.

6. The semiconductor device of claim 1 wherein an effective resistance of said second plurality of cells is characterized as in the range of 50-200 times an effective resistance of said first plurality of cells.

7. The semiconductor device of claim 1 wherein said second plurality of cells are configured to have a threshold voltage that is different from a threshold voltage of said first plurality of cells.

8. The semiconductor device of claim 1 further comprising a Zener diode coupled between said auxiliary gate and a common drain of said semiconductor device.

9. The semiconductor device of claim 8 wherein a nominal voltage of said Zener diode is in a range of 10-15% below a rated voltage of said first plurality of cells.

10. The semiconductor device of claim 1 further comprising a clamping circuit coupled between said auxiliary gate and a common drain of said semiconductor device, wherein a nominal clamping voltage of said clamping circuit is below an avalanche breakdown voltage of said first plurality of cells.

11. A gate-controlled semiconductor device comprising:
    a source terminal;
    a drain terminal;
    a primary gate terminal configured to control current from said drain terminal to said source terminal in a first fraction of channel area of said semiconductor device; and
    an auxiliary gate terminal configured to control current from said drain terminal to said source terminal in a second fraction of channel area of said semiconductor device,
    wherein said primary gate terminal, said auxiliary gate terminal, said source terminal and said drain terminal are electrically isolated from one another.

12. The semiconductor device of claim 11 further comprising a channel region comprising silicon.

13. The semiconductor device of claim 11 wherein said auxiliary gate terminal is electrically coupled to said drain terminal on a die of said semiconductor device.

14. The semiconductor device of claim 11 wherein said auxiliary gate terminal is electrically coupled to said source terminal via an explicit resistance on a die of said semiconductor device.

15. A gate-controlled semiconductor device comprising:
a plurality of primary cells, comprising:
- a primary source, a primary drain, and primary channel regions;
- a primary gate electrode coupled to a primary gate terminal of said semiconductor device;

a plurality of auxiliary cells, comprising:
- an auxiliary source, an auxiliary drain, and auxiliary channel regions;
- an auxiliary gate electrode coupled to an auxiliary gate terminal of said semiconductor device, wherein said primary source and said primary drain are coupled in parallel with said auxiliary source and said auxiliary drain forming a common source and a common drain, and wherein said primary gate terminal, said auxiliary gate terminal, said common source and said common drain are electrically isolated from one another.

16. The semiconductor device of claim 15 wherein an effective resistance of all of said auxiliary channel regions is in a range of 90-100 times an effective resistance of all of said primary channel regions.

17. The semiconductor device of claim 15 wherein said plurality of auxiliary cells are evenly and regularly distributed among said plurality of primary cells.

18. The semiconductor device of claim 15 further comprising a Zener diode coupled between said auxiliary gate terminal and said common drain on a same die of said semiconductor device.

19. The semiconductor device of claim 15 further comprising an explicit resistance coupled between said auxiliary gate terminal and said common source on a same die of said semiconductor device.

20. The semiconductor device of claim 15 wherein said auxiliary gate terminal is coupled to an external package terminal.

\* \* \* \* \*